United States Patent
Mortigami

Patent Number: 5,299,163
Date of Patent: Mar. 29, 1994

[54] SEMICONDUCTOR MEMORY DEVICE WITH DISCRIMINATOR FOR DIAGNOSTIC MODE OF OPERATION

[75] Inventor: Seiichi Mortigami, Tokyo, Japan

[73] Assignee: NEC Corporation, Japan

[21] Appl. No.: 898,119

[22] Filed: Jun. 15, 1992

[30] Foreign Application Priority Data

Jun. 27, 1991 [JP] Japan .................. 3-183097

[51] Int. Cl.$^5$ ............... G11C 13/00; G06F 11/00
[52] U.S. Cl. .................. 365/201; 371/21.4; 371/28
[58] Field of Search ............. 371/21.4, 28; 365/201

[56] References Cited

U.S. PATENT DOCUMENTS 4,958,324  9/1990  Devin .................. 365/201
4,965,768  10/1990  Takeuchi ............... 365/201

Primary Examiner—Joseph A. Popek
Assistant Examiner—Viet Q. Nguyen
Attorney, Agent, or Firm—Laff, Whitesel, Conte & Saret

[57] ABSTRACT

A semiconductor memory device is subjected to a test operation before delivery from the factory for screening defective products, and can be established in a diagnostic mode for carrying out the test operation when a discriminator acknowledges itself to be expected to produce an internal control signal for the test operation, wherein an instruction signal supplied to the discriminator has active level outside a predetermined voltage range for external signals for a standard access mode of operation so that the semiconductor memory device does not mistakenly enter the diagnostic mode after assembled in an electronic system, thereby preventing the electronic system from malfunction.

3 Claims, 3 Drawing Sheets

SEMICONDUCTOR MEMORY DEVICE WITH DISCRIMINATOR FOR DIAGNOSTIC MODE OF OPERATION

FIELD OF THE INVENTION

This invention relates to a semiconductor memory device and, more particularly, to a discriminator incorporated in the semiconductor memory device for a diagnostic mode of operation.

DESCRIPTION OF THE RELATED ART

Referring first to FIG. 1 of the drawings, a typical example of the semiconductor memory device is fabricated on a single semiconductor chip 1, and comprises a memory cell array 2, a row address buffer unit 3, a row address decoder unit 4, a column address buffer unit 5, a column address decoder unit 6, a column selector unit 7, a sense amplifier unit 8, a data output unit 9, a data input unit 10 and a control unit 11.

Though not shown in detail, the memory cell array 2 is implemented by a plurality of memory cells arranged in rows and columns, and is associated with a plurality of word lines WL as well as with a plurality of digit line pairs DL. The word lines WL are coupled with the rows of the memory cell array 2, and selects a row of the memory cells from the memory cell array 2 for a read-out operation or a write-in operation. On the other hand, the digit line pairs DL are coupled with the columns of the memory cell array 2, and propagate an write-in data bit or read-out data bits between the memory cell array 2 and either data input or data output unit 10 or 9.

The row address buffer unit 3 is coupled with a plurality of row address pins A1 to Ax, and stores row address bits indicative of a row address assigned to one of the word lines WL. The row address buffer unit 3 supplies the row address to the row address decoder unit 4, and the row address decoder unit 4 selectively drives the word lines WL. If one of the words lines WL is driven for access, the associated row of the memory cells are coupled with the associated digit line pairs DL, respectively, and data bits are read out therefrom or a data bit is written thereinto depending upon the mode of operation.

The digit line pairs are coupled with the column selector unit 7, and the column selector unit 7 couples one of the digit line pairs DL with either data input or data output unit 9 or 10. Namely, column address bits indicative of a column address are applied to column address pins A1 to Ay, and are stored in the column address buffer unit 5. Since column addresses are respectively assigned to the digit line pairs DL, the column address bits are indicative of one of the digit line pairs DL. The column address buffer unit 5 supplies the column address bits to the column address decoder unit 6, and the column address decoder unit 6 allows the column selector unit 7 to couple the digit line pair indicated by the column address bits with either data output or data input unit 9 or 10.

The data output unit 9 is coupled with a data output pin Dout, and the sense amplifier unit 8 is coupled between the column selector unit 7 and the data output unit 9. In the read-out mode of operation, one of the read-out data bits on the selected digit line pair DL is transferred through the sense amplifier unit 8 to the data output unit 9, and is delivered from the data output pin Dout after the amplification at the sense amplifier unit 8.

In the write-in mode of operation, a write-in data bit is applied to the data input pin Din, and is transferred to the data input unit 10. The data input unit 10 amplifies the write-in data bit, and transfers to the column selector unit 7. The column selector unit 7 in turn transfers the write-in data bit to one of the digit line pairs DL indicated by the column address, and the selected digit line pair propagates the write-in data bit to the memory cell coupled with the selected word line.

The control unit 11 is responsive to a write-in enable signal WE in the presence of a chip select signal CS, and the semiconductor memory device selectively enters the write-in mode or the read-out mode of operation.

In order to enhance the reliability of products, the prior art semiconductor memory device is subjected to a diagnostic operation on the memory cells as well as other component circuits upon completion of a fabricating process, and a discriminator 12 is incorporated in the semiconductor memory device for discriminating an instruction signal indicative of the diagnostic mode of operation. The instruction signal is applied to a test pin TS, and is transferred to the discriminator 12 for producing an internal control signal used for the diagnostic mode of operation.

The instruction signal applied to the test pin TS has active level as high as the active level of the other external signals supplied to the semiconductor memory device. Namely, when the instruction signal is shifted to either power voltage or ground voltage level, the discriminator 12 acknowledges itself to be expected to produce the internal control signal. After delivery from the factory, the test pin TS is never used, and is usually labeled with "NC" for informing users of disconnection. However, after assembled into an electronic system, if the active level is mistakenly applied to the test pin TS, the prior art semiconductor memory device unintentionally enters the diagnostic mode of operation, and disturbs the function of the electronic system.

SUMMARY OF THE INVENTION

It is therefore an important object of the present invention to provide a semiconductor memory device which is free from unintentional diagnostic mode of operation.

To accomplish the object, the present invention proposes to adjust active level of an instruction signal out of a voltage range for other external signals.

In accordance with the present invention, there is provided a semiconductor memory device having a standard mode for data access and a diagnostic mode for circuit components, comprising: a) a memory cell array accessible in the standard mode with external signals each swinging its voltage level in a predetermined voltage range, and subjected to a test operation in the diagnostic mode; b) peripheral circuits allowing an external device to access the memory cell array in the standard mode, and carrying out the test operation in the diagnostic mode; and c) a discriminator responsive to an instruction signal indicative of the test operation, and allowing the peripheral circuits to carry out the test operation, the instruction signal having active level outside the predetermined voltage range.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
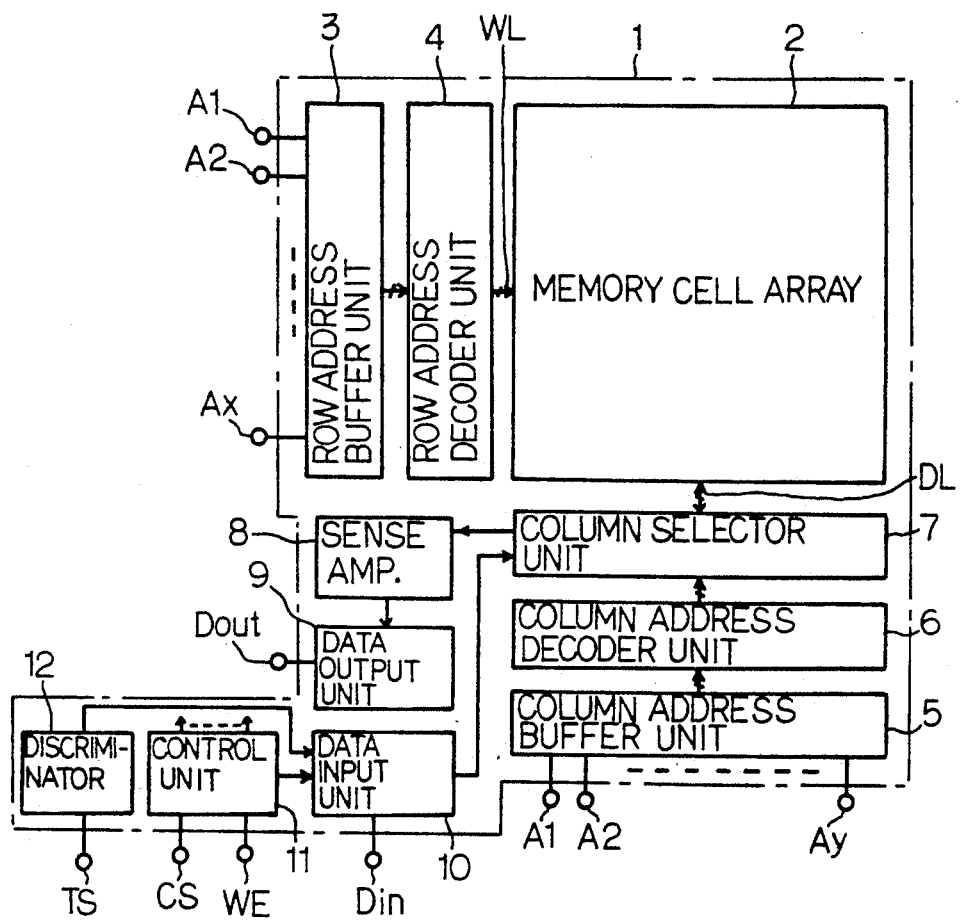
FIG. 1 is a block diagram showing the circuit arrangement of the prior art semiconductor memory device.
Figure 2:
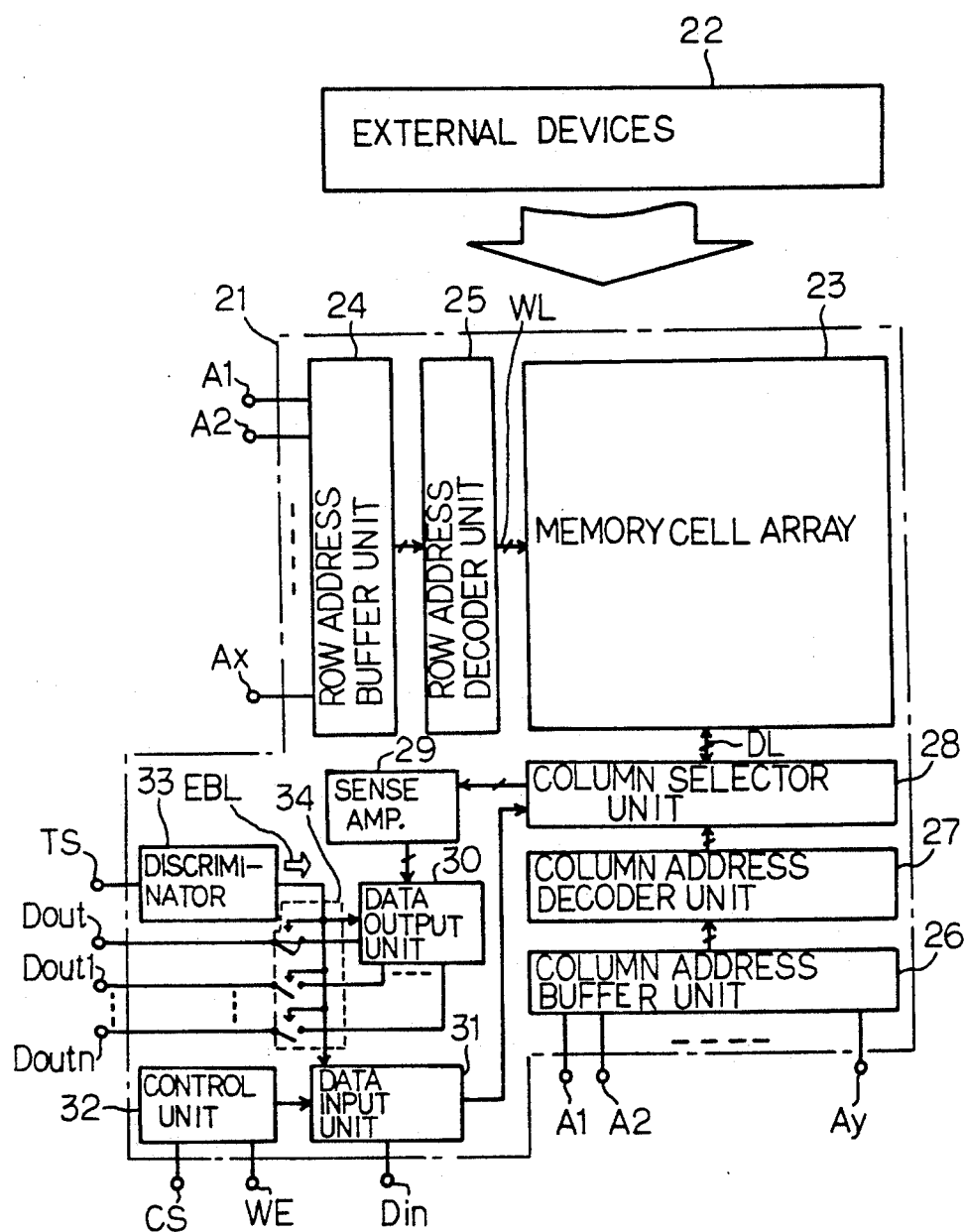
FIG. 2 is a block diagram showing the circuit arrangement of a semiconductor memory device according to the present invention.

Referring to FIG. 2 of the drawings, a semiconductor memory device embodying the present invention is fabricated on a single semiconductor chip 21, and forms in combination an electronic system together with external devices 22. The external devices 22 are communicable with the semiconductor memory device 21, and achieve predetermined tasks.

The semiconductor memory device comprises a memory cell array 23, a row address buffer unit 24, a row address decoder unit 25, a column address buffer unit 26, a column address decoder unit 27, a column selector unit 28, a sense amplifier unit 29, a data output unit 30, a data input unit 31, a control unit 32, a discriminator 33 for an instruction signal indicative of a test operation, and a switching network 34.

Though not shown in detail, the memory cell array 23 is implemented by a plurality of memory cells arranged in rows and columns. The memory cell array 23 is associated with a plurality of word lines WL as well as with a plurality of digit line pairs DL. Each of the word lines WL is coupled with one of the rows of the memory cell array 23, and selects a row of the memory cells from the memory cell arrays 23 for a read-out operation or a write-in operation. The digit line pairs DL are coupled with the columns of the memory cell array 23, respectively, and propagate an write-in data bit or read-out data bits between the memory cell array 23 and either data input or data output unit 31 or 30.

The row address buffer unit 24 is coupled with a plurality of row address pins A1 to Ax, and stores row address bits indicative of a row address assigned to one of the word lines WL. The row address buffer unit 24 supplies the row address to the row address decoder unit 25, and the row address decoder unit 25 selectively drives the word lines WL. If one of the word lines WL is driven for access, the associated a row of the memory cells are coupled with the associated digit line pairs DL, respectively, and data bits are read out therefrom or a data bit is written thereinto depending upon the mode of operation.

The digit line pairs DL are coupled with the column selector unit 28, and the column selector unit 28 couples one of the digit line pairs DL with either data input or data output unit 31 or 30. Namely, column address bits indicative of a column address are applied to column address pins A1 to Ay, and are stored in the column address buffer unit 26. Since column addresses are respectively assigned to the digit line pairs DL, the column address bits are indicative of one of the digit line pairs DL. The column address buffer unit 26 supplies the column address bits to the column address decoder unit 27, and the column address decoder unit 27 allows the column selector unit 28 to couple the digit line pair indicated by the column address bits with either data output or data input unit 30 or 31.

The data output unit 30 is selectively coupled with a data output pin Dout or data output pins Dout1 to Doutn, and the sense amplifier unit 29 is coupled between the column selector unit 28 and the data output unit 30. In the read-out mode of operation, one of the read-out data bits on the selected digit line pair DL is transferred through the sense amplifier unit 29 to the data output unit 30, and is delivered from the data output pin Dout after the amplification at the sense amplifier unit 29.

In the write-in mode of operation, a write-in data bit is applied to the data input pin Din, and is transferred to the data input unit 31. The data input unit 31 amplifies the write-in data bit, and transfers to the column selector unit 28. The column selector unit 28 in turn transfers the write-in data bit to one of the digit line pairs DL indicated by the column address, and the selected digit line pair propagates the write-in data bit to the memory cell coupled with the selected word line.

The control unit 32 is responsive to a write-in enable signal WE in the presence of a chip select signal CS, and the semiconductor memory device selectively enters the write-in mode or the read-out mode of operation.

Figure 3:
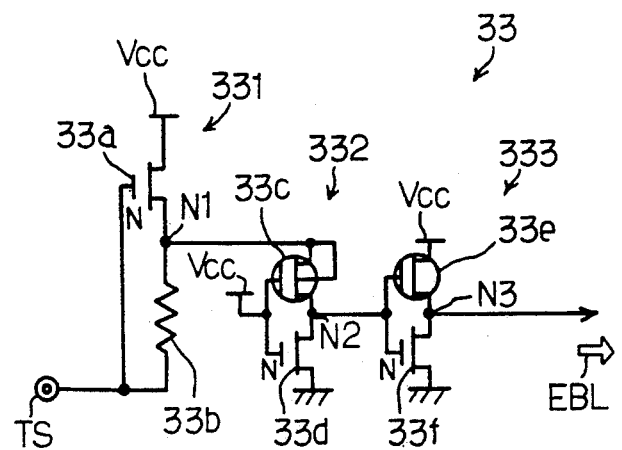
FIG. 3 is a circuit diagram showing the circuit arrangement of a discriminator for a diagnostic mode incorporated in the semiconductor memory device shown in FIG. 2.

The discriminator 33 is illustrated in FIG. 3 in detail, and largely comprises a step-down circuit 331, a level discriminating circuit 332 and an inverting circuit 333. The inverting circuit 333 serves as a control signal generating circuit.

The step-down circuit 331 is implemented by a first series combination of an n-channel enhancement type load transistor 33a and a resistive element 33b coupled between a power voltage level Vcc and a test pin TS, and the test pin TS is further coupled with the gate electrode of the n-channel enhancement type load transistor 33a. The test pin TS will be labeled with "NC" before delivery from the factory. The on-resistance of the n-channel enhancement type load transistor 33a is much larger than the resistance of the resistive element 33b, and the n-channel enhancement type load transistor 33a turns on with an instruction signal at the test pin TS higher than the power voltage level Vcc by the threshold level thereof. Then, a step-down voltage level takes place at the drain node N1 of the n-channel enhancement type load transistor 33a, and the step-down voltage level is lower than the voltage level at the test pin TS by the threshold level of the n-channel enhancement type load transistor 33a.

The level discriminating circuit 332 is implemented by a second series combination of a p-channel enhancement type field effect transistor 33c and an n-channel enhancement type field effect transistor 33d coupled between the drain node N1 and a ground voltage line, and the power voltage line Vcc is coupled with the gate electrodes of the p-channel enhancement type field effect transistor 33c and the gate electrode of the n-channel enhancement type field effect transistor 33d. The p-channel enhancement type field effect transistor 33c is smaller in on-resistance than the n-channel enhancement type load transistor 33a, and allows the step-down voltage level at the drain node N1 to be transferred to the common drain node N2 without substantial decay. If the step-down voltage level is as higher than the power voltage level Vcc by the threshold level of the p-channel enhancement type field effect transistor 33c, the p-channel enhancement type field effect transistor 33c turns on, and the drain node N1 is coupled through the p-channel enhancement type field effect transistor 33c with the common drain node N2 in the second series combination. However, if the step-down voltage level at the drain node N1 does not exceed the total sum of the power voltage level Vcc and the threshold level of the p-channel enhancement type field effect transistor 33c, the common drain node N2 is fixed to the ground voltage level. Thus, the level discriminating circuit 332 checks the drain node N1 to see whether or not the step-down voltage level is high enough to indicate the instruction for a test operation.

The inverting circuit 333 is implemented by a third series combination of a p-channel enhancement type field effect transistor 33e and an n-channel enhancement type field effect transistor 33f coupled between the power voltage level Vcc and the ground voltage level, and the common drain node N2 is coupled with the gate electrode of the p-channel enhancement type field effect transistor 33e and the gate electrode of the n-channel enhancement type field effect transistor 33f. If the common drain node N2 remains in the ground voltage level, the p-channel enhancement type field effect transistor 33e turns on, and any enable signal does not take place at the common drain node N3 in the third series combination. However, if the step-down voltage level exceeds the total sum of the power voltage level Vcc and the threshold level of the p-channel enhancement type field effect transistor 33c, the common drain node N2 allows the n-channel enhancement type field effect transistor 33f turns on, and an enable signal EBL of active low voltage level takes place at the common drain node N3. The enable signal EBL of the low voltage level is supplied to the switching array 34 and the data input unit 31, and the semiconductor memory device enters a diagnostic mode of operation. In the diagnostic mode of operation, the data input unit 31 distributes a test pattern to the memory cell array 23, and the test pattern is read out from the memory cell array 23 through the column selector unit 28, the sense amplifier unit 29, the data output unit 30 and the switching network 34 to the output data pins Dout1 to Doutn.

Thus, discriminator 33 produces the enable signal of the active low voltage level only when the test pin TS goes up to an extremely high voltage level higher than the power voltage level Vcc by at least total sum of the threshold level of the n-channel enhancement type load transistor 33a and the threshold level of the p-channel enhancement type field effect transistor 33c. In this instance, the extremely high voltage level is higher than the power voltage level Vcc by 3 to 4 volts. However, if the test pin TS is in the power voltage level Vcc, in the ground voltage level or in floating state, the drain node N1 never reaches the total sum of the power voltage level Vcc and the threshold level of the n-channel enhancement type load transistor 33a, and the common drain node N2 remains in the ground voltage level. For this reason, the common drain node N3 goes up to the power voltage level, and the enable signal EBL is never produced. This means that any test operation is never carried out. In this instance, the row and column address bits, the chip select signal CS and the write enable signal WE swing their voltage levels between the power voltage level Vcc and the ground voltage level, and, accordingly, the instruction signal has the active level outside the voltage range of the address bits, the chip select signal CS and the write enable signal WE.

Second Embodiment

Figure 4:
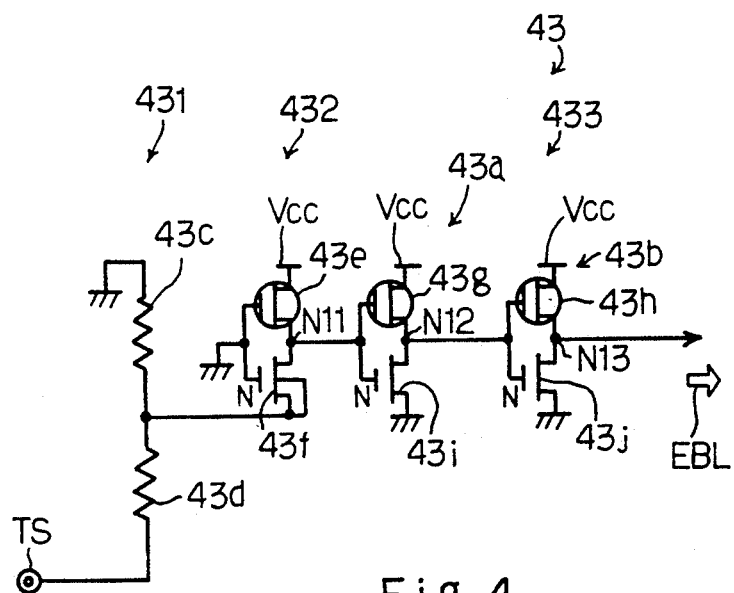
FIG. 4 is a circuit diagram showing the circuit arrangement of a discriminator for a diagnostic mode incorporated in another semiconductor memory device according to the present invention.

Turning to FIG. 4 of the drawings, a discriminator 43 incorporated in another semiconductor memory device is illustrated, and largely comprises a step-down circuit 431, a level discriminating circuit 432 and a series combination 433 of inverting circuits 43a and 43b. In this instance, the series combination 433 serves as a control signal generating circuit.

The step-down circuit 431 is implemented by a series combination of resistive elements 43c and 43d coupled between the ground voltage line and a test pin TS, and the resistive element 43c is larger in resistance than the resistive element 43d. The test pin will be labeled with "NC" before delivery from the factory, and an instruction signal indicative of the test operation is applied to the test pin TS. In this instance, the instruction signal is lower than the ground voltage level, and is outside a predetermined voltage level between the power voltage level Vcc and the ground voltage level. Row and column address bits, the chip select signal CS and the write enable signal WE swing their voltage levels in the predetermined voltage range.

The level discriminating circuit 432 is implemented by a series combination of a p-channel enhancement type field effect transistor 43e and an n-channel enhancement type field effect transistor 43f coupled between the power voltage line Vcc and the ground voltage level, and the gate electrodes of the component field effect transistors 43e and 43f are coupled with the ground voltage line. The n-channel enhancement type field effect transistor 43f is smaller in on-resistance than the p-channel enhancement type field effect transistor 43e. The inverting circuits are respectively implemented by series combinations of p-channel enhancement type field effect transistors 43g and 43h and n-channel enhancement type field effect transistors 43i and 43j coupled between the power voltage level and the ground voltage level, and are respectively gated by the common drain nodes N11 and N12. An enable signal EBL of active low voltage level takes place at the common drain node N13 only when the test pin TS is lower than the ground voltage level by the threshold level of the n-channel enhancement type field effect transistor 43f.

In this instance, the instruction signal at the test pin TS is lower than the ground voltage level by 3 to 4 volts. If the instruction signal is applied to the test pin TS, the n-channel enhancement type field effect transistor 43f turns on, and the common drain node N11 becomes around the ground voltage level. Then, the inverting circuit 43a supplies the power voltage level Vcc at the common drain node N12, and the inverting circuit 43b produces the enable signal EBL of the ground voltage level at the common drain node N13.

However, if the test pin TS is in the power voltage level Vcc, in the ground voltage level or in floating state, the n-channel enhancement type never turns on, and the common drain node N11 remains in the power voltage level Vcc. For this reason, the inverting circuit 43a supplies the ground voltage level at the common drain node N12, and the inverting circuit 43b supplies the power voltage level Vcc to the common drain node N13. This means that the enable signal EBL of the low voltage level is not produced.

As will be understood from the foregoing description, the semiconductor memory device according to the present invention is responsive to an instruction signal outside the predetermined voltage range, and never mistakenly enters the diagnostic mode of operation. For this reason, the semiconductor memory device is never causative of malfunction of an electronic system.

Although particular embodiments of the present invention have been shown and described, it will be obvious to those skilled in the art that various changes and modifications may be made without departing from the spirit and scope of the present invention. For example, the discriminator according to the present invention is available for any integrated circuit device equipped with a built-in diagnostic circuit.

What is claimed is:

1. A semiconductor memory device having a standard mode for data access and a diagnostic mode for circuit components, said device comprising:
   a) a memory cell array accessible in said standard mode with external signals, each of said external signals swinging its voltage level in a predetermined voltage range, and being subjected to a test operation in said diagnostic mode;
   b) peripheral circuits for giving an external device access said memory cell array in said standard mode, and for carrying out said test operation in said diagnostic mode; and
   c) a discriminator responsive to an instruction signal indicative of said test operation, for enabling said peripheral circuits to carry out said test operation, said instruction signal having an active level outside said predetermined voltage range, said discriminator comprising
      c-1) a step-down circuit coupled with a test pin supplied with said instruction signal, and implemented by a first series combination of a load transistor of a first channel conductivity type and a resistive element coupled between a power voltage line and said test pin, said test pin being further coupled with the gate electrode of said load transistor,
      c-2) a level discriminating circuit coupled with said step-down circuit for checking said test pin to see whether or not the voltage level at said test pin is outside said predetermined voltage range, and
      c-3) a control signal generating circuit associated with said level discriminating circuit, and operative to produce a control signal indicative of said test operation when said level discriminating circuit confirms that the voltage level at the test pin is outside said predetermined voltage range.

2. A semiconductor memory device having a standard mode for data access and a diagnostic mode for circuit components, said device comprising:
   a) a memory cell array accessible in said standard mode with external signals, each of said external signals swinging its voltage level in a predetermined voltage range, and being subjected to a test operation in said diagnostic mode;
   b) peripheral circuits for giving an external device access said memory cell array in said standard mode, and for carrying out said test operation in said diagnostic mode; and
   c) a discriminator responsive to an instruction signal indicative of said test operation, and for enabling said peripheral circuits to carry out said test operation, said instruction signal having an active level outside said predetermined voltage range, said discriminator comprising
      c-1) a step-down circuit coupled with a test pin supplied with said instruction signal, said step-down circuit comprising a series combination of a first resistive element, an intermediate node and a second resistive element coupled between a constant voltage line and said test pin where said instruction signal is applied,
      c-2) a level discriminating circuit coupled with said step-down circuit for checking said test pin to determine whether or not the voltage level at said test pin is outside said predetermined voltage range, and
      c-3) a control signal generating circuit associated with said level discriminating circuit, said control signal generating circuit being operative to produce a control signal indicative of said test operation when said level discriminating circuit confirms that the voltage level at the test pin is outside said predetermined voltage range.

3. A semiconductor memory device having a standard mode for data access and a diagnostic mode for circuit components, comprising:
   a) a memory cell array accessible in said standard mode with external signals, each of said signals swinging its voltage level in a predetermined voltage range, and being subjected to a test operation in said diagnostic mode;
   b) peripheral circuits for giving an external device to access said memory cell array in said standard mode, and for carrying out said test operation in said diagnostic mode; and
   c) a discriminator responsive to an instruction signal indicative of said test operation, and for allowing said peripheral circuits to carry out said test operation, said instruction signal having an active level outside said predetermined voltage range, said discriminator comprising
      c-1) a step-down circuit coupled with a test pin supplied with said instruction signal,
      c-2) a level discriminating circuit coupled with said step-down circuit for checking said test pin to determine whether or not the voltage level at said test pin is outside said predetermined voltage range, said level discriminating circuit comprising a series combination of a p-channel enhancement type first transistor and an n-channel enhancement type second transistor coupled between a constant voltage line and an intermediate node, said constant voltage line being coupled with a gate electrode of said p-channel enhancement type first transistor and a gate electrode of said n-channel enhancement type second transistor, and
      c-3) a control signal generating circuit associated with said level discriminating circuit, and operative to produce a control signal indicative of said test operation when said level discriminating circuit confirms that the voltage level at the test pin is outside said predetermined voltage range.

* * * * *